United States Patent [19]

Gaku et al.

[11] Patent Number: 4,937,132

[45] Date of Patent: Jun. 26, 1990

[54] LAMINATING MATERIAL FOR PRINTED CIRCUIT BOARD OF LOW DIELECTRIC CONSTANT

[75] Inventors: Morio Gaku; Hidenori Kinbara, both of Tokyo, Japan

[73] Assignee: Mitsubishi Gas Chemical Company, Inc., Tokyo, Japan

[21] Appl. No.: 288,370

[22] Filed: Dec. 22, 1988

[30] Foreign Application Priority Data

Dec. 23, 1987 [JP] Japan .................. 62-323759
Apr. 11, 1988 [JP] Japan .................. 63-87265
May 24, 1988 [JP] Japan .................. 63-124906
Jun. 6, 1988 [JP] Japan .................. 63-137278

[51] Int. Cl.$^5$ .................. B32B 9/00
[52] U.S. Cl. .................. 428/209; 428/221; 428/222; 428/227; 428/280; 428/285; 428/457; 428/474.4; 428/411.1; 428/522; 428/901; 361/317; 361/414; 174/258
[58] Field of Search .............. 428/209, 280, 285, 457, 428/474.4, 522, 411.1, 901, 221, 222, 227; 174/68.5; 361/397, 414

[56] References Cited

U.S. PATENT DOCUMENTS

| | | | |
|---|---|---|---|
| 3,895,158 | 7/1975 | Gause et al. | 428/220 |
| 3,972,765 | 8/1976 | Kondo et al. | 428/273 |
| 4,241,132 | 12/1980 | Pratt et al. | 428/285 |
| 4,372,347 | 2/1983 | Olson | 428/225 |
| 4,451,527 | 5/1984 | Olyphant, Jr. | 428/220 |
| 4,550,051 | 10/1985 | Spielau et al. | 428/285 |
| 4,563,385 | 1/1986 | Bhatt et al. | 428/251 |
| 4,579,772 | 4/1986 | Bhatt et al. | 428/229 |
| 4,707,565 | 11/1987 | Kasai et al. | 428/248 |
| 4,772,509 | 9/1988 | Komada et al. | 428/251 |

FOREIGN PATENT DOCUMENTS 0124800 4/1984 European Pat. Off. .
2171356A 8/1986 United Kingdom .

*Primary Examiner*—Patrick Ryan
*Attorney, Agent, or Firm*—Sughrue, Mion, Zinn, Macpeak & Seas

[57] ABSTRACT

A printed circuit board material composed of a reinforcing base material and a cured or uncured resin is disclosed, in which the base material is a fabric woven from hybrid yarns each of which is prepared from (I-1) at least one multifilament yarn made of glass fiber having a dielectric constant at 1 MHz of not higher than 5.5 or (I-2) at least one multifilament yarn made of heat resistant engineering plastic fiber having a dielectric constant at 1 MHz of not higher than 5.5 and (II) at least one yarn made of fluoroplastic long fiber and the thermosetting resin is a thermosetting resin whose dielectric constant after curing is not higher than 3.7. The material is excellent in dielectric properties and characteristics required for use in printed circuit board, such as heat resistance in soldering, flexural strength and peel strength of copper foil. The material shows substantial constancy of dielectric constant even with change of resin content and is therefore particularly suitable for use in a multilayer printed circuit board.

18 Claims, No Drawings

LAMINATING MATERIAL FOR PRINTED CIRCUIT BOARD OF LOW DIELECTRIC CONSTANT

FIELD OF THE INVENTION

This invention relates to a laminating material for a printed circuit board having a low dielectric constant comprising fabric woven from hybrid yarns as a reinforcing base material More particularly, it relates to a laminating material for a printed circuit board, including a laminate board, a copper-clad (single- or double-sided) laminate board, and a prepreg for adhesion for printed circuit boards or multi-layer printed circuit boards, which has a substantially low dielectric constant and high strength and is therefore suitable for high-speed operation or a high-frequency circuit. It further relates to a laminating material for multi-layer printed circuit boards which shows substantially the same level of dielectric properties even with a change of a quantitative ratio of a resin to a reinforcing base material.

BACKGROUND OF THE INVENTION

Known multi-layer printed circuit boards of low dielectric constant include laminates composed of a fluoroplastic and a glass cloth reinforcing sheet. However, these circuit boards have low strength, and a fluoroplastic film serving for adhesion of laminates should be heated to a high temperature of 350° C. or higher to exert its adhesion.

Thermosetting resin laminates using fluoroplastic fabric as a base material are also known, but they similarly have low strength. Also known are laminates comprising glass fabric as a base material and a thermosetting resin matrix having incorporated therein a fluoroplastic powder, but they are inferior in adhesion to a metal foil.

In addition, known laminating materials for a multi-layer printed circuit board include laminates having a combination of glass cloth/epoxy resin, a combination of glass cloth/fluoroplastic, a combination of fluoroplastic fabric/epoxy resin, and the like. In any of these materials, there is a large difference between the reinforcing base material and the resin in dielectric constant, and a change of resin content in the laminate is attended by a considerable change of dielectric constant. In multi-layer printed circuit boards, since copper-clad laminates or adhesive prepregs having various thicknesses are used, it has been difficult to regulate the resin content in each insulation layer constituting the multi-layer printed circuit board. Accordingly, the insulation layers show scatter of dielectric properties among the laminate. In particular, such scatter gives rise to a serious problem as the dielectric constant of the laminating material becomes lower.

SUMMARY OF THE INVENTION

One object of this invention is to provide a laminating material for a printed circuit board in which a circuit can be printed on an insulation layer having a substantially low dielectric constant.

Another object of this invention is to provide a laminating material for a printed circuit board which exhibits satisfactory strength, interlaminar bonding, and adhesion to a metal foil.

A further object of this invention is to provide a laminating material for multi-layer printed circuit boards having constancy of dielectric constant among laminates thereof.

In the light of the objects described above, the inventors have conducted extensive investigations and completed the instant invention as a result.

The present invention relates to a printed circuit board material of low dielectric constant, inclusive of a laminate board for a multi-layer printed circuit board composed of one or more insulation layers each comprising a base material and a cured thermosetting resin, a metal-clad laminate board composed of one or more insulation layers each comprising a base material and a cured thermosetting resin and a metal foil layer on one or both sides of the board, and a prepreg for adhesion comprising a base material and a thermosetting resin, wherein said base material is (A) fabric woven from hybrid yarns each of which is prepared from (I-1) at least one multifilament yarn made of glass fiber having a dielectric constant at 1 MHz of not higher than 5.5 or (I-2) at least one multifilament yarn made of heat resistant engineering plastic fiber having a dielectric constant at 1 MHz of not higher than 5.5 and (II) at least one yarn made of fluoroplastic long fiber and said thermosetting resin is (B) a thermosetting resin whose dielectric constant at 1 MHz after curing is not higher than 3.7.

The present invention also relates to a multi-layer printed circuit board material, inclusive of a laminate board for a multi-layer printed circuit board composed of one or more insulation layers each comprising a base material and a cured thermosetting resin, a metal-clad laminate board composed of one or more insulation layers each comprising a base material and a cured thermosetting resin and a metal foil layer on one or both sides of the board, and a prepreg for adhesion comprising a base material and a thermosetting resin, wherein said base material is (A) fabric woven from hybrid yarns each of which is prepared from (I-1) at least one multifilament yarn made of glass fiber having a dielectric constant at 1 MHz of not higher than 5.5 or (I-2) at least one multifilament yarn made of heat resistant engineering plastic fiber having a dielectric constant at 1 MHz of not higher than 5.5 and (II) at least one yarn made of fluoroplastic long fiber; said thermosetting resin is (B) a thermosetting resins whose dielectric constant at 1 MHz after curing is not higher than 3.7; and said fabric (A) and the cured thermosetting resin or the thermosetting resin after curing have substantially the same dielectric constant.

In preferred embodiments of the present invention, the yarn (II) made of fluoroplastic long fiber is (II-1) a multifilament yarn, (II-2) a porous monofilament yarn, or (II-3) a porous multifilament yarn; and/or the heat resistant engineering plastic fiber comprises at least one resin selected from the group consisting of totally aromatic polyamide, polyphenylene sulfide, polyether ether ketone, polyether-imide, and totally aromatic polyester; and/or the fabric (A) is one having been subjected to plasma treatment.

DETAILED DESCRIPTION OF THE INVENTION

The multifilament yarn made of glass fiber having a dielectric constant at 1 MHz (hereinafter the same) of not higher than 5.5 (I-1) is a yarn prepared by twisting 50 to 800 monofilaments of glass fiber each having a diameter of 3 to 13 $\mu$m. The glass fiber to be used suitably includes D glass, S glass, S II glass, T glass, and quartz glass, each having an $SiO_2$ content of 50% by weight or more, and preferably 65% by weight or more.

The yarn made of heat resistant engineering plastic fiber (I-2) is a yarn made by twisting 5 to 400 monofilaments of heat resistant engineering plastic fiber each having a diameter of 5 to 40 μm. The heat resistant engineering plastic fiber preferably includes those made of totally aromatic polyamide (aramid fiber), polyphenylene sulfide, polyether ether ketone, polyetherimide, and totally aromatic polyester.

The yarn made of fluoroplastic long fiber (II) is selected from (II-1) a multifilament yarn made of fluoroplastic long fiber, (II-2) a porous monofilament yarn made of fluoroplastic long fiber, and (II-3) a porous multifilament yarn made of fluoroplastic long fiber. The yarn made of fluoroplastic long fiber is a yarn obtained by twisting 5 to 120 porous or nonporous monofilaments of fluoroplastic fiber each having a diameter of 10 to 40 μm or a porous monofilament yarn of fluoroplastic fiber. The fluoroplastic to be used includes polytetrafluoroethylene, a tetrafluoroethylene-hexafluoro propylene copolymer, an olefin-tetrafluoroethylene copolymer, etc. The porous filament of the fluoroplastic long fiber can be produced by known processes, such as a cold drawing process, a process in which a soluble component is incorporated into the resin and the dissolved component is then removed, and a process in which an easily combustible or decomposable component is incorporated into the resin and the component is then removed by combustion or decomposition.

At least one of the yarn (I) and at least one of the yarn (II) are formed into one yarn (hereinafter referred to as a hybrid yarn).

The method for forming a hybrid yarn from the yarns (I) and (II) is not particularly restricted and includes, for example, a method comprising intertwisting these yarns together, and a method comprising winding or knitting the yarn(s) (II) around the yarn(s) (I) (generally called "covering yarn"). The number of twists, turns or knits is selected from the range of from 10 to 1,000/m. The average cross section area ratio of the yarn(s) (I) to the yarn(s) (II) in the hybrid yarn (hereinafter simply referred to as cross section area ratio) is selected from the range of from 2:8 to 8:2.

One or a desired number of the hybrid yarn is or are woven into plain fabric, satin fabric or twilled fabric (plain fabric is preferred), each having a thickness of from 0.03 to 0.40 mm (hereinafter referred to as fabric (A)).

The resulting fabric (A) may be used as such. If desired, adhesion to a thermosetting resin composition which is applied to the fabric can be improved by subjecting the fabric (A) to surface treatment, such as known plasma treatment with argon, ammonia, etc., surface treatment with metallic sodium, and surface treatment with a metallic sodium-based surface treating agent (e.g., a naphthalene-sodium complex treating liquid obtained by mixing 1 mol/liter of naphthalene, 1 mol/liter of sodium, and several mol/liter of tetrahydrofuran), or a coupling agent (e.g., a silane coupling agent, a titanate coupling agent, etc.). Composite twisted yarn fabric having been treated with argon or ammonia plasma is particularly preferred. It is also possible to use yarns of fluoroplastics, yarns of heat resistant engineering plastics, or yarns of glass fiber each of which has previously been subjected to the abovedescribed surface treatment.

The thermosetting resin (B) whose dielectric constant after curing is not more than 3.7 includes cyanato resins (cf. Japanese Patent Publication Nos. 41-1928, 45-11712 and 44-1222, German Patent No. 1,190,184, and U.S. Pat. No. 4,578,439); cyanic ester-maleimide resins and cyanic ester-maleimide-epoxy resins (cf. Japanese Patent Publication Nos. 54-30440 and 52-31279, and U.S. Pat. No. 4,110,364), cyanic ester-epoxy resin (cf. Japanese Patent Publication No. 46-41112 corresponding to U.S. Pat. No. 3,562,214 and German Patent No. 1,720,663), cyanic ester type resins (e.g., a composition comprising a cyanato resin and a high-boiling compound having linearly linked 2 to 7, on average, aromatic nuclei each of which is unsubstituted or substituted with a halogen or a lower alkyl group, as described in U.S. patent application Ser. No. 07/204,156, filed Apr. 26, 1988), modified maleimide resins mainly comprising a polyfunctional maleimide and a diamine, an epoxy compound or an isocyanate compound (cf. Japanese Patent Publication No. 48-8279), isocyanate-oxazolidone resins mainly comprising an isocyanate compound and an epoxy compound (cf. JP-A-55-75418, the term "JP-A" as used herein means an "unexamined published Japanese patent application"), compositions comprising polyphenylene ether and a cross-linking monomer or prepolymer; as well as thermosetting resin compositions comprising the above-enumerated resins and known curing agents or curing catalysts therefor, e.g., amines, acid anhydrides, phenols, organic metal salts, metal chelates, organic peroxides, etc. Preferred of them are compositions comprising a cyanato resin and a high-boiling compound having linearly linked 2 to 7, on average, aromatic nuclei each of which is unsubstituted or substituted with a halogen atom or a lower alkyl group.

For the purpose of imparting to the thermosetting resin (B) various properties, such as flexibility, adhesion (especially to the fibrous base), resistance to combustion, and parting properties, or defoaming, the thermosetting resin (B) may contain less than 30% by weight of silicone compounds, fluorine-containing compounds, silane coupling agents, titanate coupling agents, waxes, diene type rubbers, noncrystalline to low-crystalline saturated polyester resins, urethane resins, vinyl acetate resins, polyethylene resins, reactive low-molecular weight compounds serving as a viscosity regulator, i.e., reactive diluents, including aromatic vinyl compounds (e.g., styrene), acrylates (e.g., trimethylolpropane tri(meth)acrylate), and monoglycidyl ethers. In particular, addition of a coupling agent is preferred for improving adhesion to the base.

The thermosetting resin (B) is then applied to the fabric (A) through impregnation, coating, or adhesion to prepare a prepreg in a known manner. The amount of the resin to be applied to the fabric (A) preferably ranges from 20 tu 80% based on the total volume of the prepreg. In more detail, the application of the resin to the base material can be carried out by a process comprising impregnating a varnish of the thermosetting resin dissolved in a solvent into the base material and drying; a process comprising preparing a liquid thermosetting resin composition at room temperature or under heating without using any solvent and impregnating the composition into the base material; a process comprising preparing a powdered thermosetting resin, applying the powder to the base material and heat-melting the resin powder to fix it to the base material; a process comprising forming a thermosetting resin layer on a film or sheet having parting properties and melt-transferring the resin layer onto the base material; and the like. The impregnation is carried out after substantially removing air from a solvent solution, a solvent steam, etc., by an appropriate means, such as evacuation in vacuo.

The metal foil which can be used in the present invention includes those commonly employed for metal-clad laminate boards, such as a copper foil, an iron foil, an aluminum foil, an aluminum/copper foil, etc. One or both sides of the metal foil may be subjected to surface treatment, or a metal foil having an adhesive layer may be used.

The laminating material for printed circuit boards according to the present invention includes a laminate and a metal foil-clad laminate for producing a single layer or double layer printed circuit board; a laminate, a metal foil-clad laminate and a prepreg for producing a multi-layer printed circuit board; and the like, prepared by using a laminate and a prepreg, or a laminate, a prepreg and a metal foil produced by conventional laminate molding techniques.

In laminate molding, prepregs other than those of the present invention may be partly used in combination.

As described above, in the present invention, a material for a printed circuit board having a substantially low dielectric constant can be provided by using the above-described fabric (A) as a base material, and in particular, since the individual yarns constituting the fabric have substantially the same dielectric constant, there is provided a material for a printed circuit board of low dielectric constant which shows constancy of dielectric constant between any two points even close to each other within a weaving pitch distance.

The dielectric constant of the fabric (A) can be controlled by varying the proportion of the yarn (I) to the yarn (II). The dielectric constant of the resin composition can also be controlled to some extent. Accordingly, dielectric constants of both the base and the resin can be controlled so as to be substantially the same, thereby making it possible to produce laminating materials for a multi-layer printed circuit board having substantial constancy of dielectric constant even if the amount of the resin is varied.

The above-mentioned substantial constancy of dielectric constant can be achieved by selecting a combination of the resin and base so as to control the difference of dielectric constant between them within 10%. For example, a thermosetting polyimide resin having a dielectric constant of 3.6 is combined with a base material composed of S glass (major components: $SiO_2$ 65%, $Al_2O_3$ 25%, and MgO 10%) and tetrafluoroethylene fiber, the cross section area ratio thereof ranging from 6:4 to 4:6; a cyanato resin having a dielectric constant of 2.9 is combined with a base material composed of D glass fiber and tetrafluoroethylene fiber, the cross section area ratio thereof ranging from 5:5 to 3:7 or a base material composed of aramid fiber and tetrafluoroethylene fiber, the cross section area ratio thereof ranging from 4:6 to 6:4 are combined.

Since the base material and the resin in the laminating material according to the present invention have substantially the same dielectric constant, a multi-layer printed circuit board prepared from such laminating materials does not show a large variation of electrical characteristics even if there is a variation of the resin content among prepregs or a variation of interlaminar distance due to a variation of laminate molding conditions. A multi-layer printed circuit board can thus be designed requiring no substantial consideration for these variation.

The present invention is now illustrated in greater detail by way of the following examples and comparative examples, but it should be understood that the present invention is not deemed to be limited thereto. In these examples, all the parts and percents are by weight unless otherwise indicated.

EXAMPLE 1

A multifilament yarn composed of 180 monofilaments made of D glass (major components: $SiO_2$ 75%, $B_2O_3$ 20%; minor components: MgO, CaO, LiO, $Na_2O$, $K_2O$, etc.) each having a diameter of 8 $\mu$m and a multifilament yarn composed of 60 monofilaments made of tetrafluoroethylene each having a diameter of 22 $\mu$m were intertwisted together to obtain a hybrid yarn (cross section area ratio: glass/fluoroplastic=36/64). The resulting hybrid yarns were woven into plain fabric having a count of 42×36/25 mm and a thickness of 0.2 mm (dielectric constant $\epsilon$=3.0).

The resulting fabric was subjected to argon plasma treatment (0.2 Torr, 110 kHz, 25 kv, 1 minute (6 m/min)) and then surface treatment with an epoxysilane coupling agent.

Ninety-five parts of a 2,2-bis(4-cyanatophenyl)propane prepolymer (number average molecular weight: 1,000), 5 parts of a bisphenol A type epoxy resin (epoxy equivalent: 450 to 500), and 0.01 part of acetylacetonatoiron were dissolved in methyl ethyl ketone (MEK) to prepare a varnish. The resin composition was found to have a dielectric constant of 3.3 after curing as measured at 1 MHz.

The fabric was impregnated with the varnish and dried at 140° C. for 6 minutes to obtain a prepreg having a resin content of 48%. Eight sheets of the resulting prepregs were laid up, and an 18 $\mu$m thick copper foil was superposed on both sides thereof. The layup was laminate-molded at 175° C. for 2 hours at a pressure of 40 kg/cm2 to prepare a copper-clad (double-sided) laminate board having a thickness of 1.6 mm.

Dielectric constant and dissipation factor (tan $\delta$) at 1 MHz, heat resistance in soldering at 260° C. for 30 seconds, and flexural strength of the resulting laminate board, and peel strength of the copper foil of the laminate were measured. The results obtained are shown in Table 1.

EXAMPLE 2

The procedure of Example 1 was repeated, except for using a hybrid yarn obtained by intertwisting a multifilament yarn composed of 180 monofilaments made of D glass each having a diameter of 8 $\mu$m and two multifilament yarns made of tetrafluoroethylene fiber each composed of 15 monofilaments having a filament diameter of 22 $\mu$m. The results obtained are shown in Table 1.

EXAMPLE 3

A multifilament yarn composed of 90 monofilaments made of S glass (major component: $SiO_2$ 65%, $Al_2O_3$ 25%, MgO 10%) each having a diameter of 8 $\mu$m and two multifilament yarns each composed of 20 monofilaments made of tetrafluoroethylene fiber having a filament diameter of 22 $\mu$m were intertwisted to obtain a hybrid yarn (cross section area: glass/fluoroplastic=30/70). The hybrid yarns were woven into plain fabric having a count of 60×55/25 mm and a thickness of 0.1 mm (dielectric constant ε=3.2), and the fabric was subjected to surface treatments in the same manner as in Example 1.

Seventy-nine parts of a 2,2-bis(4-cyanatophenyl)propane prepolymer (number average molecular weight: 1,000), 20 parts of tetrabromodiphenyl ether, and 1 part of a phenol novolak epoxy resin (epoxy equivalent: 172 to 179) were dissolved in MEK, and 0.03 part of zinc octylate was dissolved therein to prepare a varnish. The resin composition was found to have a dielectric constant of 3.0 after curing (at 1 MHz).

The fabric was impregnated with the varnish and dried at 140° C. for 6 minutes to obtain a prepreg having a resin content of 48%. Two sheets of the prepreg were laid up, and a 35 μm-thick copper foil was superposed on both sides of the layup. The layup was laminate-molded at 175° C. for 2 hours at a pressure of 40 kg/cm² to obtain a copper-clad (double-sided) laminate board having a thickness of 0.2 mm. The results obtained are shown in Table 1.

EXAMPLE 4

The procedure of Example 1 was repeated, except for replacing the multifilament glass fiber yarn as used in Example 1 with a multifilament quartz fiber yarn composed of 180 monofilaments made of quartz (major component: SiO$_2$ 99.9%) each having a diameter of 9 μm. The results obtained are shown in Table 1.

EXAMPLE 5

The procedure of Example 4 was repeated, except for using a hybrid yarn prepared by intertwisting a multifilament yarn composed of 180 monofilaments made of quartz each having a diameter of 9 μm and two multifilament yarns each composed of 30 monofilaments made of tetrafluoroethylene each having a diameter of 22 μm. The results obtained are shown in Table 1.

EXAMPLE 6

The procedure of Example 3 was repeated, except for using a hybrid yarn prepared by twisting two multifilaments each composed of 50 monofilaments made of tetrafluoroethylene fiber each having a diameter of 8 μm around a core of a multifilament yarn composed of 90 monofilaments made of quartz each having a diameter of 7 μm. The results obtained are shown in Table 1.

glass each having a diameter of 8 μm and a multifilament yarn composed of 60 porous monofilaments made of tetrafluoroethylene fiber each having a diameter of 22 μm. The results obtained are shown in Table 2 below.

EXAMPLE 8

The procedure of Example 2 was repeated, except for using a hybrid yarn obtained by intertwisting a multifilament yarn composed of 180 monofilaments made of D glass each having a diameter of 8 μm and two multifilament yarns each composed of 15 porous monofilaments made of tetrafluoroethylene fiber each having a diameter of 22 μm. The results obtained are shown in Table 2.

EXAMPLE 9

The procedure of Example 3 was repeated, except for using a hybrid yarn obtained by intertwisting a multifilament yarn composed of 90 monofilaments made of S glass each having a diameter of 8 μm and two multifilament yarns each composed of 20 porous monofilaments made of tetrafluoroethylene fiber each having a diameter of 22 μm. The results obtained are shown in Table 2.

EXAMPLE 10

The procedure of Example 4 was repeated, except for using a hybrid yarn obtained by intertwisting a multifilament yarn composed of 180 monofilaments made of quartz each having a diameter of 9 μm and a multifilament yarn composed of 60 porous monofilaments made of tetrafluoroethylene fiber each having a diameter of 22 μm. The results obtained are shown in Table 2.

EXAMPLE 11

The procedure of Example 5 was repeated, except for using a hybrid yarn obtained by intertwisting a multifilament yarn composed of 180 monofilaments made of quartz each having a diameter of 9 μm and two multifilament yarns each composed of 30 porous monofilaments made of tetrafluoroethylene fiber each having a diameter of 22 μm. The results obtained are shown in Table 2.

EXAMPLE 12

The procedure of Example 6 was repeated, except for using a hybrid yarn obtained by twisting two multifilament yarns each composed of 50 porous monofilaments made of tetrafluoroethylene fiber each having a diameter of 8 μm around a multifilament yarn composed of 90 monofilaments made of quartz each having a diameter of 7 μm. The results obtained are shown in Table 2.

TABLE 1

| | Example 1 | Example 2 | Example 3 | Example 4 | Example 5 | Example 6 |
|---|---|---|---|---|---|---|
| Board Thickness (mm) | 1.6 | 1.6 | 0.2 | 1.6 | 1.6 | 0.2 |
| Dielectric Properties (at 1 MHz): | | | | | | |
| ε | 3.2 | 3.2 | 3.2 | 3.1 | 3.1 | 2.8 |
| tan δ | 0.0028 | 0.0028 | 0.0018 | 0.0023 | 0.0023 | 0.0010 |
| Heat Resistance in Soldering (260° C., 30 sec) | No abnormality was observed in every example. | | | | | |
| Flexural Strength (kg/mm²) | 22 | 22 | — | 20 | 20 | — |
| Peel Strength of Copper Foil (kg/cm) | 1.1 | 1.1 | 1.6 | 1.5 | 1.5 | 1.3 |

EXAMPLE 7

The procedure of Example 1 was repeated, except for using a hybrid yarn obtained by intertwisting a multifilament yarn composed of 180 monofilaments made of D

TABLE 2

|  | Example 7 | Example 8 | Example 9 | Example 10 | Example 11 | Example 12 |
|---|---|---|---|---|---|---|
| Board Thickness (mm) | 1.6 | 1.6 | 0.2 | 1.6 | 1.6 | 0.2 |
| Dielectric Properties at 1 MHz: |  |  |  |  |  |  |
| $\epsilon$ | 3.2 | 3.2 | 3.2 | 3.1 | 3.1 | 2.8 |
| tan $\delta$ | 0.0028 | 0.0028 | 0.0018 | 0.0023 | 0.0023 | 0.0010 |
| Heat Resistance in Soldering (260° C., 30 sec) | No abnormality was observed in every example. | | | | | |
| Flexural Strength (kg/mm$^2$) | 22 | 22 | — | 20 | 20 | — |
| Peel Strength of Copper Foil (kg/cm) | 1.1 | 1.1 | 1.6 | 1.5 | 1.5 | 1.3 |

EXAMPLE 13

The procedure of Example 1 was repeated, except for using a hybrid yarn obtained by winding a multifilament yarn composed of 50 porous monofilaments made of tetrafluoroethylene fiber each having a diameter of 22 μm around a multifilament yarn composed of 100 monofilaments made of aramid fiber each having a diameter of 12 μm with a number of turns of 500/min (cross section area ratio: aramid/fluoroplastic=37/63). The results obtained are shown in Table 3.

EXAMPLE 14

The procedure of Example 1 was repeated, except for using a hybrid yarn obtained by winding two multifilament yarns each composed of 15 porous monofilaments made of tetrafluoroethylene fiber each having a diameter of 22 μm around a multifilament yarn composed of 44 monofilaments made of polyether-imide each having a diameter of 18 μm with a number of turns of 600/m (cross section area ratio: polyether-imide/fluoroplastic=50/50). The results obtained are shown in Table 3.

EXAMPLE 15

The procedure of Example 1 was repeated, except for using a hybrid yarn obtained by winding two multifilament yarns each composed of 15 porous monofilaments made of tetrafluoroethylene fiber each having a diameter of 22 μm around a multifilament yarn made of polyether ether ketone each having a diameter of 18 μm with a number of turns of 600/min (cross section area ratio: polyether ether ketone/fluoroplastic=50/50). The results obtained are shown in Table 3.

EXAMPLE 16

The procedure of Example 1 was repeated, except for using a hybrid yarn obtained by winding two multifilament yarns each composed of 15 porous monofilaments made of tetrafluoroethylene each having a diameter of 22 μm around a multifilament yarn made of polyphenylene sulfide each having a diameter of 18 μm with a number of turns of 600/min (cross section area ratio: polyphenylene sulfide/fluoroplastic=50/50). The results obtained are shown in Table 3.

EXAMPLE 17

The procedure of Example 3 was repeated, except for using a hybrid yarn obtained by knitting two multifilament yarns each composed of 20 porous monofilaments made of tetrafluoroethylene each having a diameter of 22 μm around a multifilament yarn composed of 100 monofilaments made of aramid fiber each having a diameter of 12 μm (cross section area ratio: aramid/fluoroplastic=42/58). The results obtained are shown in Table 3.

TABLE 3

|  | Example 13 | Example 14 | Example 15 | Example 16 | Example 17 |
|---|---|---|---|---|---|
| Board Thickness (mm) | 1.6 | 1.6 | 1.6 | 1.6 | 0.2 |
| Dielectric Properties (at 1 MHz): |  |  |  |  |  |
| $\epsilon$ | 3.2 | 2.8 | 3.0 | 3.2 | 3.2 |
| tan $\delta$ | 0.005 | 0.0031 | 0.0045 | 0.0038 | 0.005 |
| Heat Resistance in Soldering (260° C., 30 sec) | No abnormality was observed in every example. | | | | |
| Flexural Strength (kg/mm$^2$) | 18 | 18 | 19 | 19 | — |
| Peel Strength of Copper Foil (kg/cm) | 1.1 | 1.1 | 1.2 | 1.2 | 1.6 |

EXAMPLE 18

A multifilament yarn composed of 30 monofilaments made of tetrafluoroethylene each having a diameter of 22 μm was wound around a multifilament yarn composed of 230 monofilaments made of D glass each having a diameter of 8 μm with a number of turns of 500/min to obtain a hybrid yarn (dielectric constant $\epsilon$=3.0). The resulting hybrid yarns were woven into plain fabric having a count of 42×36/25 mm and a thickness of 0.2 mm, and the fabric was subjected to surface treatments in the same manner as in Example 1.

Ninety parts of a 2,2-bis(4-cyanatophenyl)-propane prepolymer (number average molecular weight: 1,000), 10 parts of a low-molecular polystyrene ("PICCOLASTIC A Resin" produced by Hercules Inc.), and 0.03 part of zinc octylate were dissolved in MEK to prepare a varnish. The resin composition was found to have a dielectric constant of 3.0 (at 1 MHz) after curing.

The fabric as above prepared was impregnated with the varnish and dried at 140° C. for 6 minutes to prepare a prepreg having a resin content varying from 40 to 60%. Eight sheets of the prepreg were laid up, and an 18 μm-thick copper foil was superposed on both sides of the prepreg laminate. The layup was then laminate-molded at 175? C. for 2 hours at a pressure of 40 kg/cm$^2$ to obtain a copper-clad (double-sided) laminate board having a thickness of 1.6 mm. The results obtained are shown in Table 4 below.

TABLE 4

|  | Run No. 1 | Run No. 2 | Run No. 3 | Run No. 4 |
|---|---|---|---|---|
| Resin Content (%) | 40 | 50 | 55 | 60 |
| Dielectric Properties |  |  |  |  |

TABLE 4-continued

|  | Run No. 1 | Run No. 2 | Run No. 3 | Run No. 4 |
|---|---|---|---|---|
| at 1 MHz: |  |  |  |  |
| ε | 3.0 | 3.0 | 3.0 | 3.0 |
| tan δ | 0.0012 | 0.0013 | 0.0014 | 0.0015 |
| Heat Resistance in Soldering (260° C., 30 sec) | No abnormality was observed in every example. | | | |
| Flexural Strength (kg/mm²) | 28 | 25 | 23 | 20 |
| Peel Strength of Copper Foil (kg/cm) | 1.2 | 1.2 | 1.2 | 1.2 |

COMPARATIVE EXAMPLE 1

The procedure of Example 18 was repeated, except for using plan fabric woven from yarns each composed of 400 monofilaments made of D glass fiber. The dielectric properties of the resulting laminate are shown in Table 5 below.

TABLE 5

|  | Run No. 1 | Run No. 2 | Run No. 3 | Run No. 4 |
|---|---|---|---|---|
| Resin Content (%) | 40 | 50 | 55 | 60 |
| Dielectric Properties at 1 MHz: |  |  |  |  |
| ε | 3.7 | 3.5 | 3.4 | 3.3 |
| tan δ | 0.0013 | 0.0014 | 0.0015 | 0.0016 |

EXAMPLE 19

A yarn composed of 30 porous monofilaments made of polytetrafluoroethylene each having a diameter of 22 μm was wound around a yarn composed of 230 monofilaments made of S glass each having a diameter of 8 μm at a rate of 500 turns/m to obtain a hybrid yarn (dielectric constant ε=3.7). The resulting hybrid yarns were woven into plain fabric having a count of 42×36/25 mm and a thickness of 0.2 mm, and the fabric was treated with an epoxysilane coupling agent.

A thermosetting polyimide resin ("Kelimide 601") was dissolved in N-methylpyrrolidone to prepare a varnish. This resin composition was found to have a dielectric constant of 3.6 (at 1 MHz) after curing.

The above obtained fabric was impregnated with the varnish and dried at 160° C. for 6 minutes to prepare a prepreg having a varying resin content of from 40 to 60%. Eight sheets of the prepreg were laid up, and an 18 μm-thick copper foil was superposed on both sides of the prepreg layup. The layup was laminate-molded at 240° C. for 2 hours at a pressure of 40 kg/cm² to obtain a copper-clad (double-sided) laminate board having a thickness of 1.6 mm. The results obtained are shown in Table 6 below.

TABLE 6

|  | Run No. 1 | Run No. 2 | Run No. 3 | Run No. 4 |
|---|---|---|---|---|
| Resin Content (%) | 40 | 50 | 55 | 60 |
| Dielectric Properties at 1 MHz: |  |  |  |  |
| ε | 3.6 | 3.6 | 3.6 | 3.6 |
| tan δ | 0.0080 | 0.0085 | 0.0085 | 0.0090 |
| Heat Resistance in Soldering (260° C., 30 sec) | No abnormality was observed in every example. | | | |
| Flexural Strength (kg/mm²) | 20 | 19 | 19 | 18 |
| Peel Strength of Copper Foil (kg/cm) | 1.1 | 1.1 | 1.1 | 1.1 |

As is apparent from the foregoing description, the laminating material for a printed circuit board according to the present invention, in which a fabric woven from a hybrid yarn obtained from one or more multifilament glass fiber yarns having a dielectric constant of not more than 5.5 and one or more fluoroplastic fiber yarns, is excellent in dielectric properties and characteristics required for use in printed circuit boards, such as heat resistance in soldering, flexural strength and peel strength of copper foil. Hence, the laminating material of the present invention proves suitable as a printed circuit board, a laminate of a multi-layer printed circuit board or an adhesive prepreg for high frequency circuits.

In particular, the laminating material of the invention shows substantial constancy of dielectric constant even with change of resin content impregnated into or coated on the base material. When it is used as an interlayer sheet, an adhesive prepreg, or a copperclad laminate board for producing a multi-layer printed circuit board by laminate molding, a desired level of dielectric properties can be maintained even if the resin content is varied among the insulation layers. Thus, it is especially suited as a material for a multi-layer printed circuit board.

While the invention has been described in detail and with reference to specific embodiments thereof, it will be apparent to one skilled in the art that various changes and modifications can be made therein without departing from the spirit and scope thereof.

What is claimed is:

1. A printed circuit board material having a low dielectric constant, which includes an insulation layer comprising a base material and a cured thermosetting resin and a prepreg for adhesion comprising a base material and a thermosetting resin, wherein said base material is (A) a fabric woven from hybrid yarns each of which is prepared from (I-1) at least one multifilament yarn made of glass fiber having a dielectric constant at 1 MHz of not higher than 5.5 or (I-2) at least one multifilament yarn made of heat resistant engineering plastic fiber having a dielectric constant at 1 MHz of not higher than 5.5 and (II) at least one yarn made of fluoroplastic long fiber and said thermosetting resin is (B) a thermosetting resin whose dielectric constant at 1 MHz after curing is not higher than 3.7.

2. A printed circuit board material as claimed in claim 1; wherein said yarn (II) made of fluoroplastic long fiber is (II-1) a multifilament yarn, (II-2) a porous monofilament yarn, or (II-3) a porous multifilament yarn.

3. A printed circuit board material as claimed in claim 1/ wherein said heat resistant engineering plastic fiber comprises at least one resin selected from the group consisting of totally aromatic polyamide, polyphenylene sulfide, polyether ether ketone, polyetherimide, and totally aromatic polyester.

4. A printed circuit board material as claimed in claim 1, wherein said fabric (A) is plasma treated.

5. A printed circuit board material having a low dielectric constant, which includes an insulation layer comprising a base material and a cured thermosetting resin and a prepreg for adhesion comprising a base material and a thermosetting resin, wherein said base material is (A) a fabric woven from hybrid yarns each of which is prepared from (I-1) at least one multifilament yarn made of glass fiber having a dielectric constant at 1 MHz of not higher than 5.5 or (I-2) at least one multifilament yarn made of heat resistant engineering plastic fiber having a dielectric constant at 1 MHz of not higher than 5.5 and (II) at least one yarn made of fluoroplastic long fiber; said thermosetting resin is (B) a thermosetting resin whose dielectric constant at 1 MHz after curing is not higher than 3.7; and said fabric (A) and the cured thermosetting resin or the thermosetting resin after curing have substantially the same dielectric constant.

6. A printed circuit board material as claimed in claim 5, wherein said yarn (II) made of fluoroplastic long fiber is (II-1) a multifilament yarn, (II-2) a porous monofilament yarn, or (II-3) a porous multifilament yarn.

7. A printed circuit board material as claimed in claim 1, wherein said hybird yarn comprises said (I-1) or said (I-2) yarn and said (II) yarn intertwisted together.

8. A printed circuit board material as claimed in claim 1, wherein said hybrid yarn comprises said (II) yarn wound or knit around said (I-1) or said (I-2) yarn.

9. A printed circuit board material as claimed in claim 7, wherein, the average cross section area ratio of said (I-I) or said (I-2) yarn to said (II) yarn is 2:8 to 8:2.

10. A printed circuit board material as claimed in claim 8, wherein the average cross section area ratio of said (I-1) or said (I-2) yarn to said (II) yarn is 2:8 to 8:2.

11. A printed circuit board material as claimed in claim 1, wherein said (I-1) yarn is used.

12. A printed circuit board material as claimed in claim 1, wherein said (I-2) yarn is used.

13. A printed circuit board material as claimed in claim 5, wherein said hybrid yarn comprises said (I-1) or said (I-2) yarn and said (II) yarn intertwisted together.

14. A printed circuit board material as claimed in claim 5, wherein said hybrid yarn comprises said (II) yarn wound or knit around said (I-1) or said (I-2) yarn.

15. A printed circuit board material as claimed in claim 13, wherein the average cross section area ratio of said (I-1) or said (I-2) yarn to said (II) yarn is 2:8 to 8:2.

16. A printed circuit board material as claimed in claim 14, wherein the average cross section area ratio of said (I-1) or said (I-2) yarn to said (II) yarn is 2:8 to 8:2.

17. A printed circuit board material as claimed in claim 5, wherein said (I-1) yarn is used.

18. A printed circuit board material as claimed in claim 5, wherein said (I-2) yarn is used.

* * * * *